United States Patent
Willeke et al.

(10) Patent No.: US 9,159,683 B2
(45) Date of Patent: Oct. 13, 2015

(54) METHODS FOR ETCHING COPPER DURING THE FABRICATION OF INTEGRATED CIRCUITS

(71) Applicants: GLOBALFOUNDRIES Inc., Grand Cayman (KY); Intermolecular Inc., San Jose, CA (US)

(72) Inventors: Reiner Willeke, Dresden (DE); Tanya Atanasova, Dresden (DE); Anh Duong, Fremont, CA (US); Greg Nowling, San Jose, CA (US)

(73) Assignees: GLOBALFOUNDRIES, INC., Grand Cayman (KY); INTERMOLECULAR, INC., San Jose, CA (US)

( * ) Notice: Subject to any disclaimer, the term of this patent is extended or adjusted under 35 U.S.C. 154(b) by 0 days.

(21) Appl. No.: 14/176,697

(22) Filed: Feb. 10, 2014

(65) Prior Publication Data

US 2015/0228595 A1 Aug. 13, 2015

(51) Int. Cl.
*H01L 21/44* (2006.01)
*H01L 23/00* (2006.01)
*H01L 21/3213* (2006.01)

(52) U.S. Cl.
CPC .......... *H01L 24/11* (2013.01); *H01L 21/32134* (2013.01); *H01L 21/32139* (2013.01); *H01L 24/13* (2013.01); *H01L 2224/1162* (2013.01); *H01L 2224/11614* (2013.01); *H01L 2224/11831* (2013.01); *H01L 2224/13023* (2013.01); *H01L 2224/13147* (2013.01); *H01L 2924/014* (2013.01); *H01L 2924/0105* (2013.01); *H01L 2924/01022* (2013.01); *H01L 2924/01047* (2013.01); *H01L 2924/2064* (2013.01); *H01L 2924/20102* (2013.01)

(58) Field of Classification Search
USPC ............ 438/612–618; 257/E23.021, E23.069
See application file for complete search history.

(56) References Cited

U.S. PATENT DOCUMENTS

| | | |
|---|---|---|
| 2004/0080024 A1 | 4/2004 | Datta |
| 2011/0254151 A1 | 10/2011 | Lin et al. |
| 2012/0064712 A1* | 3/2012 | Lei et al. ................. 438/614 |
| 2012/0273945 A1 | 11/2012 | Chang |

* cited by examiner

*Primary Examiner* — Jasmine Clark
(74) *Attorney, Agent, or Firm* — Ingrassia Fisher & Lorenz, P.C.

(57) ABSTRACT

Methods for etching copper in the fabrication of integrated circuits are disclosed. In one exemplary embodiment, a method for fabricating an integrated circuit includes providing an integrated circuit structure including a copper bump structure and a copper seed layer underlying and adjacent to the copper bump structure and etching the seed layer selective to the copper bump structure using a wet etching chemistry consisting of $H_3PO_4$ in a volume percentage of about 0.07 to about 0.36, $H_2O_2$ in a volume percentage of about 0.1 to about 0.7, and a remainder of $H_2O$, and optionally $NH_4OH$.

14 Claims, 5 Drawing Sheets

METHODS FOR ETCHING COPPER DURING THE FABRICATION OF INTEGRATED CIRCUITS

TECHNICAL FIELD

The present disclosure generally relates to methods for fabricating integrated circuits. More particularly, the present disclosure relates to methods for etching copper during the fabrication of integrated circuits.

BACKGROUND

The majority of present day integrated circuits are implemented by using a plurality of interconnected field effect transistors (FETs), also called metal oxide semiconductor field effect transistors (MOSFETs), or simply MOS transistors. A MOS transistor includes a gate electrode as a control electrode and spaced apart source and drain regions between which a current can flow. A control voltage applied to the gate electrode controls the flow of current through a channel between the source and drain regions.

Modern integrated circuits can be made up of literally millions of active devices, such as transistors, capacitors, and the like. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits. On top of the interconnect structures, bond pads are formed and exposed on the surface of the respective semiconductor wafer or "chip." Electrical connections are made through bond pads to connect the chip to a package substrate or another die. Bond pads can be used for wire bonding or so-called "flip-chip" bonding. As known in the art, a flip chip, also known as a controlled collapse chip connection or its acronym, "C4," is a method for interconnecting semiconductor devices, such as integrated circuit chips and micro-electromechanical systems (MEMS), to external circuitry with solder bumps that have been deposited onto the chip pads. The solder bumps are deposited on the chip pads on the top side of the wafer during the final wafer processing step. In order to mount the chip to external circuitry (e.g., a circuit board or another chip or wafer), it is "flipped" over so that its top side faces down, and aligned so that its pads align with matching pads on the external circuit, and then the solder is flowed to complete the interconnect. This is in contrast to wire bonding, in which the chip is mounted upright and wires are used to interconnect the chip pads to external circuitry.

Structurally, a solder bump actually contains the bump itself and a so-called under-bump-metallurgy (UBM) located between the bump and a pad. An UBM generally contains an adhesion layer, a barrier layer, and a wetting layer, arranged in that order, on the pad. The bumps themselves, based on the material used, are classified as solder bumps, gold bumps, copper pillar bumps, and bumps with mixed metals. In copper pillar bump technology, instead of using a solder bump, the electronic component is connected to a substrate by means of a copper pillar bump (or more simply copper pillar), which achieves finer pitch with minimum probability of bump bridging, reduces the capacitance load for the circuits, and allows the electronic component to perform at higher frequencies.

In current practice, during wet etching of the UBM copper layer or bump in accordance with some fabrication steps, an isotropic etch profile is produced, in which the etching is at the same rate in all directions, leading to undercutting of the etched copper bump. This action results in an undesirable loss of copper pillar width. The undercut caused by the wet etching process will also induce undesirable stresses in the copper pillar, possibly resulting in bump sidewall delamination and bump cracking. Although the undercut is an inherent result of the etching process, the undercut is detrimental to the long-term reliability of the interconnection. The undercut compromises the integrity of the solder bump structure by weakening the bond between the solder bump and the bonding pad of the chip, thereby leading to premature failure of the chip.

Accordingly, it is desirable to provide improved methods for fabricating integrated circuits that include copper layers, such as copper bumps. It further is desirable to provide methods for fabricating integrated circuits that avoid undercutting the copper bump during etching of one or more of the copper layers. Furthermore, other desirable features and characteristics of the present disclosure will become apparent from the subsequent detailed description and the appended claims, taken in conjunction with the accompanying drawings and the foregoing technical field and background.

BRIEF SUMMARY

Methods for etching copper in the fabrication of integrated circuits are disclosed. In one exemplary embodiment, a method for fabricating an integrated circuit includes providing an integrated circuit structure including a copper bump structure and a copper seed layer underlying and adjacent to the copper bump structure and etching the seed layer selective to the copper bump structure using a wet etching chemistry consisting of $H_3PO_4$ in a volume percentage of about 0.07 to about 0.36, $H_2O_2$ in a volume percentage of about 0.1 to about 0.7, and a remainder of $H_2O$, and optionally $NH_4OH$.

In another exemplary embodiment, a method for fabricating an integrated circuit includes providing an integrated circuit including a passivation layer disposed over a copper-based metallization layer. The passivation layer includes a first void region therein exposing at least a portion of the copper-based metallization layer. The method further includes depositing a titanium-containing barrier layer over the passivation layer and over the exposed portion of the copper-based metallization layer. Depositing the titanium-containing layer is performed such that the layer is deposited to a thickness of about 500 to about 2000 Angstrom. The method further includes depositing, using physical vapor deposition processes, a copper seed layer over the titanium-containing barrier layer. The copper seed layer is deposited to a thickness of about 500 to about 10000 Angstrom. The method further includes depositing and patterning a mask layer over the copper seed layer. The deposited and patterned mask layer includes a second void region that exposes the copper seed layer within the first void region. Still further, the method includes depositing, using electro-chemical deposition, a copper bump structure within the second void region to a height of about 40 µm to about 70 µm, depositing a SnAg solder layer over the copper bump structure, and etching, by applying a wet etchant, the copper seed layer and the titanium-containing barrier layer selective to the copper bump structure and the solder layer. The wet etchant has a wet etching chemistry consisting of $H_3PO_4$ in a volume percentage of about 0.07 to about 0.36, $H_2O_2$ in a volume percentage of about 0.1 to about 0.7, and a remainder of $H_2O$, and optionally $NH_4OH$. Etching consists of etching the copper seed layer and the titanium-containing barrier layer in areas that are not underneath the copper bump structure in addition to an under-cut of the copper bump structure to an extent less than about 1 micron.

In yet another exemplary embodiment, a method for fabricating an integrated circuit includes providing an integrated circuit structure comprising a copper bump structure, a first under-bump metallurgy (UBM) layer underlying and adjacent to the copper bump structure, and a second UBM layer underlying and adjacent to the first UBM layer, etching the first UBM layer using a first wet etching chemistry consisting of $H_3PO_4$ in a volume percentage of about 0.07 to about 0.36, $H_2O_2$ in a volume percentage of about 0.1 to about 0.7, and a remainder of $H_2O$, and optionally $NH_4OH$, and etching the second UBM layer using a second wet etching chemistry.

BRIEF DESCRIPTION OF THE DRAWINGS

The present disclosure will hereinafter be described in conjunction with the following drawing figures, wherein like numerals denote like elements, and wherein.

DETAILED DESCRIPTION

The following detailed description is merely illustrative in nature and is not intended to limit the embodiments of the subject matter or the application and uses of such embodiments. Furthermore, there is no intention to be bound by any expressed or implied theory presented in the preceding technical field, background, brief summary or the following detailed description.

The present disclosure provides methods for etching copper, and in particular methods for etching a physical vapor-deposited copper seed layer selective to an electrochemically-deposited copper bump structure, during the fabrication of integrated circuits. The disclosed methods for etching copper are performed using a novel etch chemistry that includes a combination of phosphoric acid, hydrogen peroxide, and water, with ammonium hydroxide optionally included for pH control. For the sake of brevity, conventional techniques related to integrated circuit device fabrication may not be described in detail herein. For example, the illustrated embodiments show the integrated circuits at a stage of fabrication wherein one or more circuit devices, such as transistors, resistors, and the like, have been previously formed using techniques know in the art. Moreover, the various tasks and process steps described herein may be incorporated into a more comprehensive procedure or process having additional steps or functionality not described in detail herein. In particular, various steps in the manufacture of semiconductor-based transistors are well-known and so, in the interest of brevity, many conventional steps will only be mentioned briefly herein or will be omitted entirely without providing the well-known process details.

Figure 1:
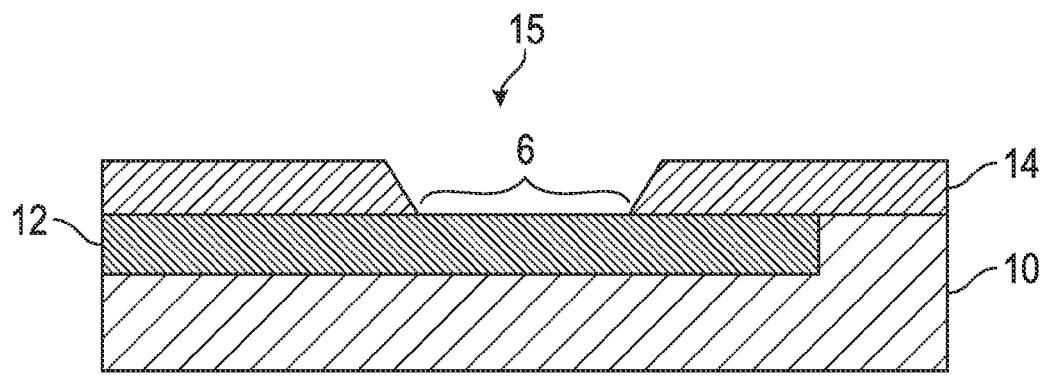
FIGS. 1-9 illustrate, in cross section, integrated circuit structures and methods for fabricating integrated circuits in accordance with various embodiments of the present disclosure.

FIGS. 1-9 illustrate, in cross section, integrated circuit structures and methods for fabricating integrated circuits in accordance with various embodiments of the present disclosure. With reference to FIG. 1, an example of a substrate 10 used for copper bump fabrication may include a semiconductor substrate as employed in semiconductor integrated circuit fabrication, and integrated circuits may be formed therein and/or thereupon. The semiconductor substrate is defined to mean any construction including semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used. The substrate 10 may further include a plurality of isolation features (not shown), such as shallow trench isolation (STI) features or local oxidation of silicon (LOCOS) features. The isolation features may define and isolate the various microelectronic elements (not shown). Examples of the various microelectronic elements that may be formed in the substrate 10 include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and other suitable processes. The microelectronic elements are interconnected to form the integrated circuit device, such as a logic device, memory device (e.g., SRAM), RF device, input/output (I/O) device, system-on-chip (SoC) device, combinations thereof, and other suitable types of devices.

The substrate 10 further includes inter-layer dielectric layers and a metallization structure overlying the integrated circuits. The inter-layer dielectric layers in the metallization structure include low-k dielectric materials, un-doped silicate glass (USG), silicon nitride, silicon oxynitride, or other commonly used materials. The dielectric constants (k value) of the low-k dielectric materials may be less than about 3.9, or less than about 2.8. Metal lines in the metallization structure may be formed of copper or copper alloys. One skilled in the art will realize the formation details of the metallization layers. A contact region 12 is a top metallization layer formed in a top-level inter-layer dielectric layer, which has an exposed surface treated by a planarization process, such as chemical mechanical polishing (CMP), if necessary. Suitable materials for the conductive region 12 may include, but are not limited to, for example copper (Cu), aluminum (Al), AlCu, copper alloy, or other mobile conductive materials, with copper being employed in an exemplary embodiment. In one embodiment, the contact region 12 is a metal pad region, which may be used in the bonding process to connect the integrated circuits in the respective chip to external features.

FIG. 1 also depicts a passivation layer 14 formed on the substrate 10 and patterned to form a first opening 15 exposing a first portion 6 of the metal pad region 12 for allowing subsequent bump formation. Regarding the purpose and function of the passivation layer 14, due to the current focus on increasing circuit density and speed, the use of copper as the interconnect material has grown significantly since copper exhibits lower resistivity and lower susceptibility to electromigration failure as compared to aluminum. Despite these advantages, one drawback of using copper is that it readily diffuses into the surrounding dielectric material during subsequent processing steps. To inhibit the diffusion of copper, copper interconnects are often capped with a protective barrier layer referred to as a passivation layer. In one embodiment, the passivation layer 14 is formed of a non-organic material selected from un-doped silicate glass (USG), silicon nitride, silicon oxynitride, silicon oxide, and combinations thereof. In another embodiment, the passivation layer 14 is formed of a polymer layer, such as an epoxy, polyimide, benzocyclobutene (BCB), polybenzoxazole (PBO), and the like, although other relatively soft, often organic, dielectric materials can also be used.

Figure 2:
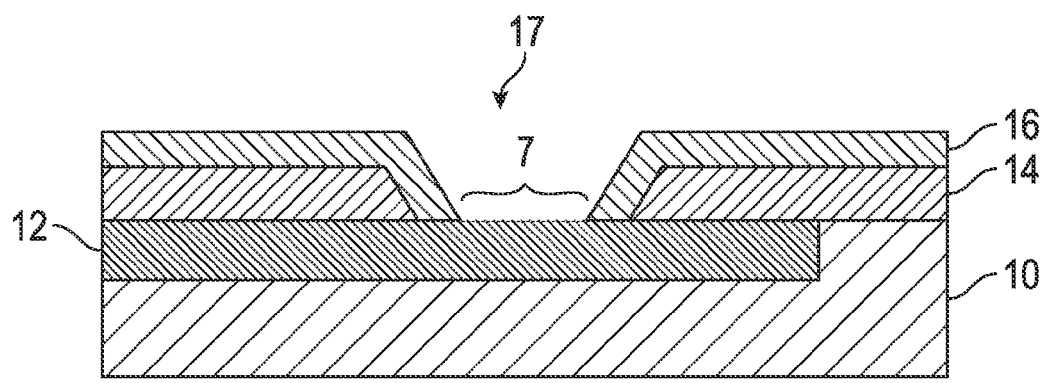

Referring now to FIG. 2, a polymer layer 16 is formed on the passivation layer 14 and patterned to form a second opening 17 exposing a second portion 7 of the metal pad region 12 for allowing subsequent bump formation. The second opening 17 may be smaller than or equal to the first opening 15. In one embodiment, the second opening 17 is positioned within the first opening 15. The polymer layer 16 may be formed of a polymer, such as an epoxy, polyimide, benzocyclobutene (BCB), polybenzoxazole (PBO), and the like, although other relatively soft, often organic, dielectric materials can also be used. In one embodiment, the polymer layer 16 is a polyimide layer. In another embodiment, the polymer layer 16 is a polybenzoxazole (PBO) layer. The polymer layer 16 is soft, and hence has the function of reducing inherent stresses on substrate. In addition, the polymer layer 16 is easily formed to thickness of tens of microns.

Figure 3:
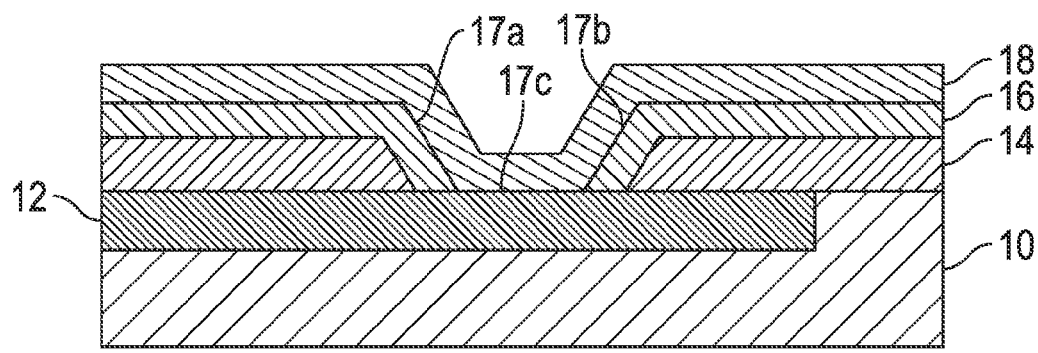

Referring to FIG. 3, the formation of a first under-bump-metallurgy (UBM) layer 18 is performed on the resulting structure. The first UBM layer 18 is formed on the polymer layer 16 and the exposed second portion 7 of the metal pad region 12, and lines the sidewalls 17a, 17b and bottom 17c of the second opening 17. The first UBM layer 18, also referred to as a diffusion barrier layer, may be formed of titanium (Ti), titanium nitride (TiN), tantalum nitride (TaN), tantalum (Ta), or the like. Examples of methods for forming the diffusion barrier layer 18 include physical vapor deposition (PVD) and sputtering. The first UBM layer 18 is deposited to a thickness from about 500 to about 2000 Angstroms, for example to a thickness of about 1000 Angstroms.

Figure 4:
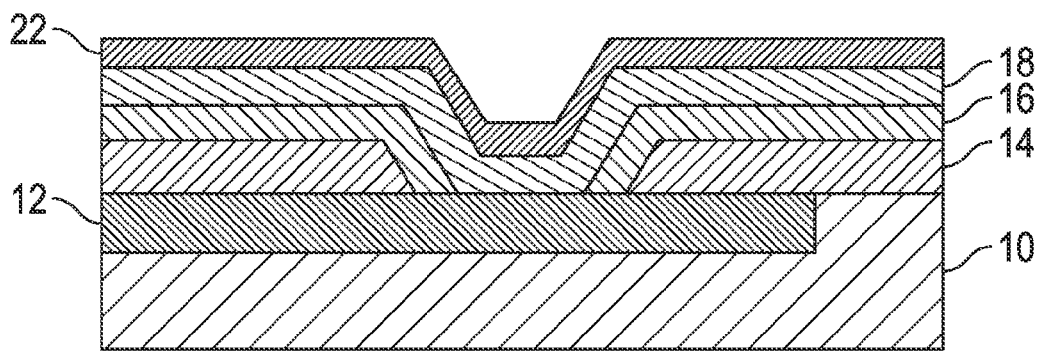

With reference to FIG. 4, a second UBM layer 22 is selectively formed on the first UBM layer 18 through a physical vapor deposition (PVD) process, sputtering, or the like. In some embodiments, the second UBM layer 22 serves as a seed layer for a subsequent electroplating process, and is formed of copper or copper alloys by physical vapor deposition or sputtering. The second UBM layer 22 is deposited to a thickness of from about 500 to about 10000 Angstroms.

Figure 5:
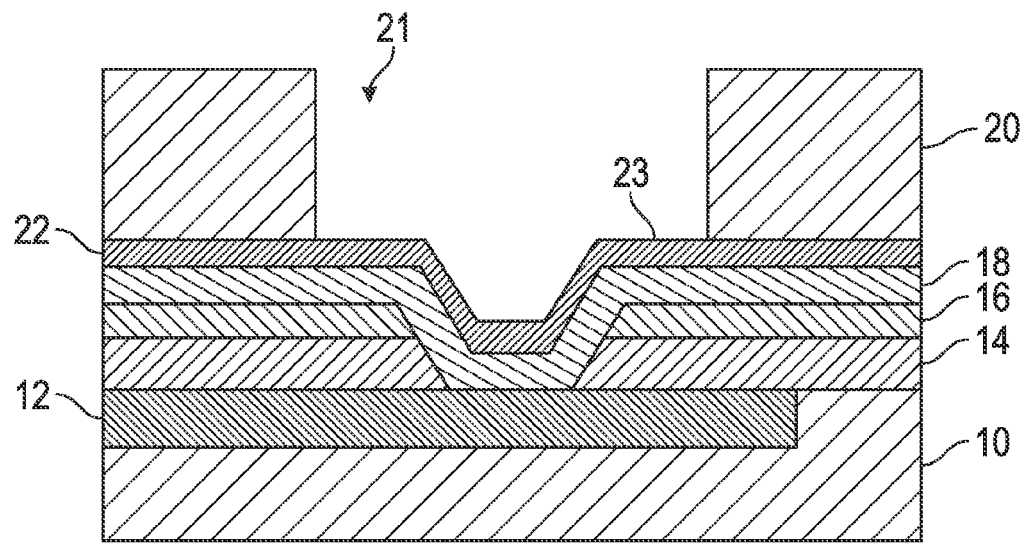

Next, as illustrated in FIG. 5, a mask layer 20 is provided on the second UBM layer 22 and patterned with a third opening 21 exposing a portion 23 of the second UBM layer 22 for bump formation. The diameter of the third opening 21 is greater or equal to the diameter of the second opening 17 of FIG. 2. The mask layer 20 is a dry film or a photoresist film formed through the steps of coating, curing, de-scum and the like, followed by lithography technology and etching processes such as a dry etch and/or a wet etch process.

Figure 6:
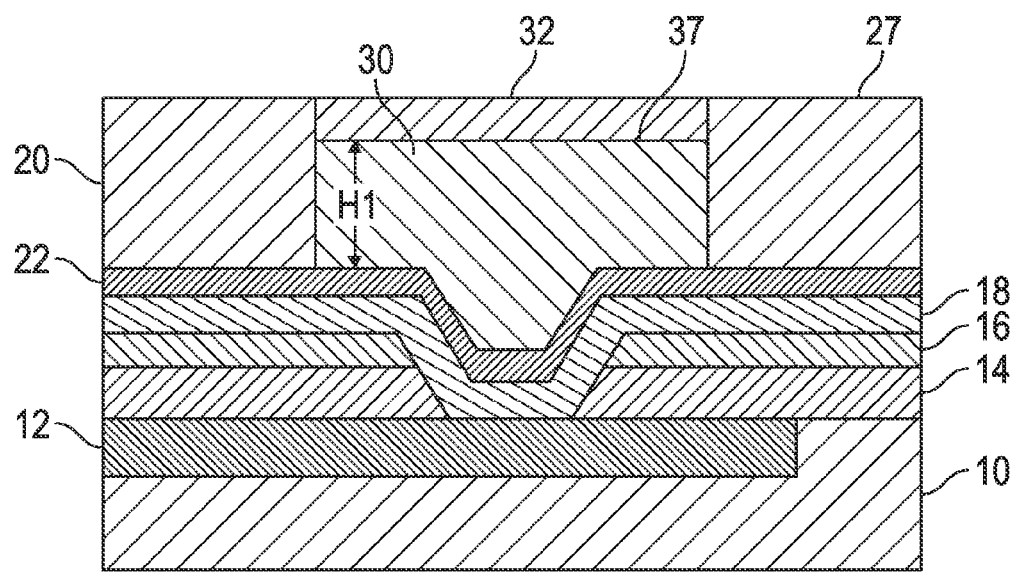

After the second UBM layer 22 and the mask layer 20 are deposited, electro-chemical plating (ECP) is carried out to form the copper bump 30 using the copper seed layer (second UBM layer 22) to initiate the ECP, as shown in FIG. 6. Alternatively, other deposition processes may be employed, such as electro-less plating, sputtering, CVD, and others. The copper bump 30 is formed so as to fill less than all of the third opening 21. The term "copper bump" is intended to include a layer including substantially pure elemental copper, copper containing unavoidable impurities, or copper alloys containing minor amounts of elements such as tantalum, indium, tin, zinc, manganese, chromium, titanium, germanium, strontium, platinum, magnesium, aluminum, or zirconium. The formation methods may include sputtering, printing, electro plating, electroless plating, or chemical vapor deposition (CVD) methods. For example, electro-chemical plating (ECP) may be carried out to form the copper bump 30. In an exemplary embodiment, the copper bump 30 has a height H1 measured from an interface with 22 most remote from the substrate 10 to a surface of copper bump 30 most remote from subtsrate 10, which is greater than about 25 µm. In another exemplary embodiment, the height H1 is greater than about 40 µm. For example, the height H1 is about 40 µm to about 70 µm, although the height may be greater or smaller. In some embodiments, the opening 21 is partially filled with the copper bump 30, thus a top surface of the copper bump 37, that is, a surface of the copper bump most remote from the substrate 10, is lower than the top surface 27 of the mask layer 20, that is, the surface of the mask layer most remote from the substrate. In other (non-illustrated) embodiments, the copper ECD process may be controlled to fill the opening 21, making the top surface 37 level with or higher than the top surface 27 of the mask layer 20.

Thereafter, the illustrated structure may be exposed to an appropriate anneal process to anneal the copper bump 30. In the annealing process, the integrated circuit is exposed to an elevated temperature, such as from about 200° C. to about 800° C., for example from about 300° C. to about 400° C., for a time period from about 1 minute to about 60 minutes, for example from about 15 minutes to about 45 minutes, although the present disclosure is not intended to be limited by any particular copper annealing conditions. As additionally shown in FIG. 6, a solder layer 32 is then formed on the second UBM layer 22 within the opening 21 of the mask layer 20. The solder layer 32 may be made of Sn, SnAg, Sn—Pb, SnAgCu (with Cu weight percentage less than about 0.3%), SnAgZn, SnZn, SnBi—In, Sn—In, Sn—Au, SnPb, SnCu, SnZnIn, or SnAgSb, etc. In one embodiment, the solder layer 32 is SnAg (with about 2% Ag).

Figure 7:
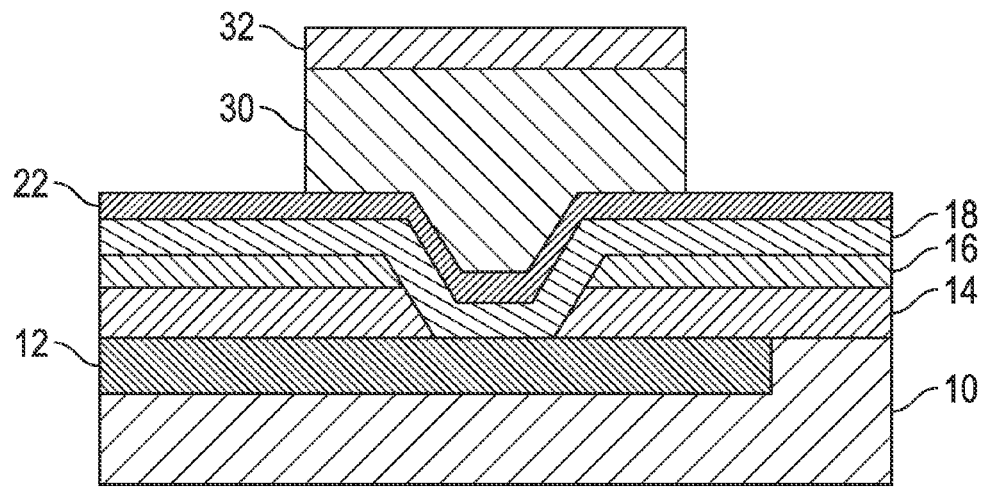

Next, as shown in FIG. 7, the mask layer 20 is removed, exposing the second UBM layer 22. In the case that the mask layer 20 is a dry film, it may be removed using an alkaline solution. If the mask layer 20 is formed of photoresist, it may be removed using acetone, n-methyl pyrrolidone (NMP), dimethyl sulfoxide (DMSO), aminoethoxy ethanol, and the like.

Figure 8:
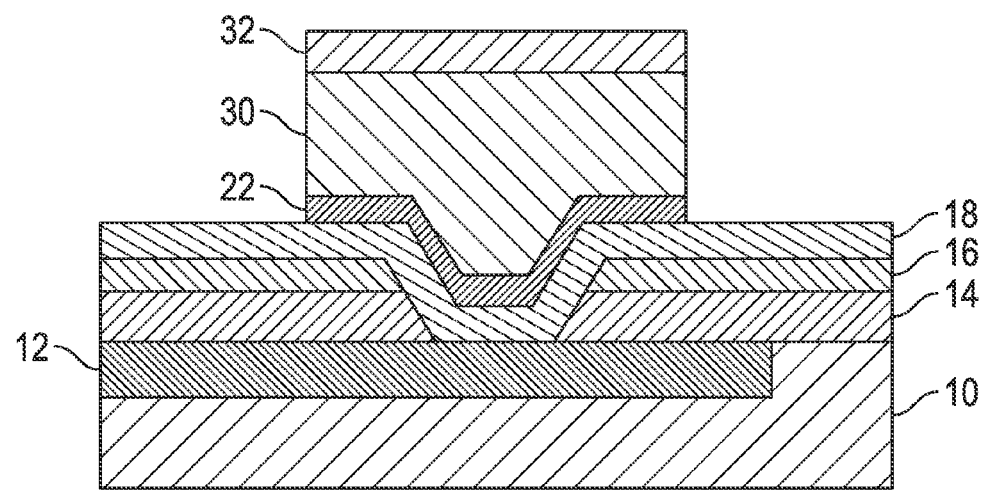

With reference now to FIG. 8, the second UBM layer 22 (copper seed layer) is etched away from over first UBM layer 18 in areas that are not underneath the copper bump 30. As initially noted above, in the prior art, in wet etching the layer 22, an isotropic etch profile is produced, in which the etching is at the same rate in all directions, leading to undercutting of the copper bump 30. This action results in an undesirable loss of width in the copper bump 30. The undercut caused by wet copper etching process will induce the stress concentration, resulting in bump sidewall delamination and bump crack. Although the undercut is an inherent result of the etching process, the undercut is detrimental to the long-term reliability of the interconnection. The undercut compromises the integrity of the solder bump structure by weakening the bond between the solder bump and the bonding pad of the chip, thereby leading to premature failure of the chip. Accordingly, it is desirable to provide methods for fabricating integrated circuits that avoid undercutting the copper bump during etching the UBM layer 22.

The present disclosure provides methods for etching copper, and in particular methods for etching a physical vapor-deposited copper seed layer selective to an electrochemically-deposited copper bump structure, in the fabrication of integrated circuits. The disclosed methods for etching copper are performed using a novel etch chemistry that includes a combination of phosphoric acid ($H_3PO_4$), hydrogen peroxide ($H_2O_2$), and water ($H_2O$), with ammonium hydroxide optionally included for pH control. In one exemplary embodiment, the wet etch chemistry includes $H_3PO_4$ in a volume percentage of about 0.07 to about 0.36, $H_2O_2$ in a volume percentage of about 0.1 to about 0.7, such as a volume percentage of about 0.1 to 0.3, and a remainder (to 100 volume percent) of $H_2O$. In some embodiments, the wet etching chemistry may include ammonium hydroxide ($NH_4OH$) in an amount sufficient to maintain the pH from about 7 to about 9. This etching chemistry is also selective to the PVD copper seed layer (second UBM layer 22) over the Ti or Ta-based barrier layer (first UBM layer 18), and as such first UBM layer 18 serves as a suitable etch stop layer for this process.

A wet etching process may be performed on the structure shown in FIG. 7 for a time period from about 60 seconds to about 5 minutes, and at a process temperature from about 30° C. to about 60° C. Process conditions may be suitably selected within the above-noted parameters based on, for example, the thickness of UBM layer 22. Additionally, a de-ionized water (DIW) rinse may be employed after the chemical wet etch exposure at room temperature to remove any excess materials that may be left on the etched substrate. After the etching process, the resulting structure is illustrated by FIG. 8. Using the disclosed etching process, the under-cut etch of copper bump 30 is minimized to less than 1 μm, for example less than 100 nm. However, all, or substantially all, of the second UBM layer 22 is removed from over first UBM layer 18 in regions that are not underneath copper bump 30.

Figure 9:
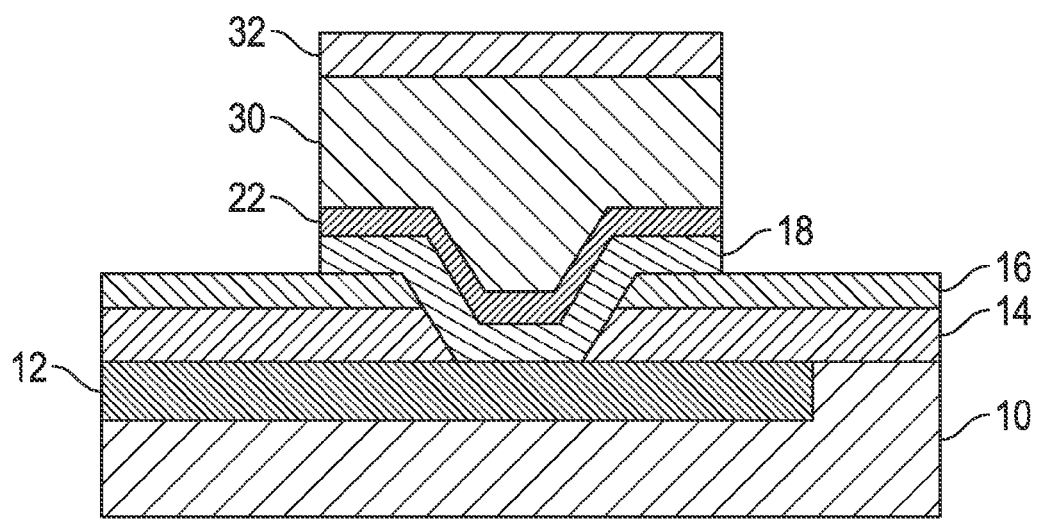

Thereafter, as shown in FIG. 9, another wet etching chemistry may be employed that is selective to Ti or Ta over copper in order to etch away portions of the first UBM layer 18 that are not under the copper bump 30. A variety of etching chemistries are known in the art to accomplish this purpose. For example, in one embodiment, about 70:1 to about 130:1 dilute hydrofluoric acid (dHF), such as about 100:1 dHF, may be applied to the structure shown in FIG. 8 to remove the first UBM layer 18 while not etching the copper bump structure 30 or the solder 32. This etching chemistry may be applied for a time period of about 30 seconds to about 40 seconds at a temperature from about 10° C. to about 40° C., in one embodiment.

Subsequent to the etching processes described above, the integrated circuit may be completed in the convention manner including, for example, interconnecting the semiconductor device to external circuitry using soldered bump 30 that has been deposited onto the semiconductor device. As such, all conventional post-processing steps as are known in the art are intended to be included within the scope of the present disclosure. Accordingly, the present disclosure has provided improved methods for fabricating integrated circuits that include copper layers, such as copper bumps. Particularly, the disclosure has provided methods for fabricating integrated circuits that substantially avoid undercutting the copper bump during etching of one or more of the copper layers (such as a copper seed layer) using the novel combination of phosphoric acid, hydrogen peroxide, and water as a wet etchant.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for fabricating an integrated circuit comprising:
    providing an integrated circuit structure comprising a copper bump structure and a copper seed layer underlying and adjacent to the copper bump structure;
    etching the seed layer selective to the copper bump structure using a wet etching chemistry comprising $H_3PO_4$ in a volume percentage of about 0.07 to about 0.36, $H_2O_2$ in a volume percentage of about 0.1 to about 0.7, and a remainder of $H_2O$, wherein etching the seed layer comprises applying the wet etchant at a temperature of about 30° C. to about 40° C.

2. The method of claim 1, wherein etching the seed layer comprises applying the wet etchant for a time period of about 60 seconds to about 5 minutes.

3. The method of claim 1, further comprising fabricating the integrated circuit structure comprising the copper bump structure and the copper seed layer underlying and adjacent to the copper bump structure.

4. The method of claim 3, wherein fabricating the integrated circuit structure comprises depositing, using physical vapor deposition processes, the copper seed layer over a passivation layer, wherein the copper seed layer is deposited to a thickness of about 500 to about 10000 Angstroms.

5. The method of claim 4, wherein fabricating the integrated circuit structure comprises depositing, using electrochemical deposition, the copper bump structure to a height of about 40 μm to about 70 μm.

6. The method of claim 5, wherein fabricating the integrated circuit structure comprises depositing a titanium-containing barrier layer prior to depositing the copper seed layer, wherein depositing the titanium-containing barrier layer comprises depositing the titanium-containing barrier layer to a thickness of about 500 to about 2000 Angstroms.

7. The method of claim 6, wherein fabricating the integrated circuit structure comprises depositing a SnAg solder layer over the copper bump structure.

8. The method of claim 7, further comprising etching using a dilute hydrofluoric acid etchant the titanium barrier layer selective to the copper bump structure and the solder layer.

9. The method of claim 1, wherein etching the copper seed layer comprises etching the copper seed layer in areas that are not underneath the copper bump structure.

10. The method of claim 9, wherein etching the copper seed layer consists of etching the copper seed layer in areas that are not underneath the copper bump structure in addition to an under-cut of the copper bump structure to an extent less than about 1 micron.

11. The method of claim 1, wherein etching the seed layer comprises applying a wet etchant using a wet etching chemistry wherein $H_2O_2$ is present in a volume percentage of about 0.1 to about 0.3.

12. A method for fabricating an integrated circuit comprising:
    providing an integrated circuit structure comprising a copper bump structure and a copper seed layer underlying and adjacent to the copper bump structure;
    etching the seed layer selective to the copper bump structure using a wet etching chemistry comprising $H_3PO_4$ in a volume percentage of about 0.07 to about 0.36, $H_2O_2$ in a volume percentage of about 0.1 to about 0.7, and a remainder of $H_2O$, wherein etching the copper seed layer comprises etching the copper seed layer in areas that are not underneath the copper bump structure in addition to an under-cut of the copper bump structure to an extent less than about 1 micron.

13. A method for fabricating an integrated circuit comprising:

providing an integrated circuit structure comprising a copper bump structure and a copper seed layer underlying and adjacent to the copper bump structure;

etching the seed layer selective to the copper bump structure using a wet etching chemistry comprising $H_3PO_4$ in a volume percentage of about 0.07 to about 0.36, $H_2O_2$ in a volume percentage of about 0.1 to about 0.7, and a remainder of $H_2O$.

14. The method of claim 13, wherein the wet etching chemistry further comprises $NH_4OH$ in an amount sufficient such that the wet etchant has a pH of about 7 to about 9.

* * * * *